United States Patent [19]
Sherman et al.

[11] Patent Number: 5,876,793
[45] Date of Patent: Mar. 2, 1999

[54] FINE POWDERS AND METHOD FOR MANUFACTURING

[75] Inventors: Andrew Sherman, Granada Hills; Victor Arrietta, Panorama City, both of Calif.

[73] Assignee: Ultramet, Pacoima, Calif.

[21] Appl. No.: 603,622

[22] Filed: Feb. 21, 1996

[51] Int. Cl.[6] .................................................. G23C 16/06
[52] U.S. Cl. ...................... 427/213; 427/214; 427/215; 427/216; 427/217; 427/251; 427/252
[58] Field of Search ..................... 427/213, 214, 427/215, 216, 217, 251, 252

[56] References Cited

PUBLICATIONS

Perry's Chemical Engineers' Handbook, Sixth Edition, Robert H. Perry Copyright 1962, 1969 by Robert H. Perry, pp. 20—58–20—61 (no month).

Fluidization, 2nd Edition, J.F. Davidson, R.Clift, D. Harrison, Chapter 7, Copyright 1985, (no month).

*Primary Examiner*—Shrive Beck
*Assistant Examiner*—Timothy Meeks
*Attorney, Agent, or Firm*—Bruce A. Jagger

[57] ABSTRACT

The invention relates to the encapsulation of Geldhart class C substrate powders with a coating of metal, binder, or sintering aid. Encapsulation is achieved using chemical vapor deposition techniques in a recirculating fast-fluidized or turbulent fluidization flow bed reactor. Thin, smooth, generally uniform, fully encapsulating coatings are produced on the fine substrate particles. The coated Geldhart class C particles, and products made therefrom, exhibit excellent improved physical properties.

26 Claims, 2 Drawing Sheets

FINE POWDERS AND METHOD FOR MANUFACTURING

BACKGROUND OF THE INVENTION

1. Field of the Invention

The invention relates in general to the coating of particulate materials which are so fine and with such high surface to volume ratios that surface phenomena tend to dominate their properties. Particularly, the invention relates to the economical coating of fine particles utilizing chemical vapor deposition procedures in a recirculating fast-fluidized or turbulent fluidized bed reactor under conditions where each particle is coated individually and agglomeration is minimized. Such fine particles may be as small as approximately 0.1 micron in diameter with aspect ratios ranging from approximately 1 to as much as approximately 100. The invention is particularly suited to the treatment of Geldhart's class C particles. The coated particulates find application, for example, as improved starting materials for plasma spray, powder metallurgy, ceramic and composite materials, conductive fillers, reinforcements, and electronic materials. For example, composite products fabricated by utilizing such fine, coated particles in traditional methods of manufacturing, such as cold pressing and hot isostatic pressing, are easily fabricated, have a reduced matrix content and exhibit superior mechanical properties and wear resistance.

2. Description of the Prior Art

Chemical vapor deposition procedures have been utilized for more than a century to apply various coatings to surfaces as well as other applications. The process involves the atom by atom accumulation of a gaseous compound onto the surface of a heated substrate. The gaseous compound undergoes a thermal or chemical decomposition as it contacts the heated substrate, resulting in deposition of the material onto the substrate. The reaction rate and consequent buildup of the compound on the substrate is governed by a number of factors, such as the characteristics of the gaseous compound, its concentration, the flow rate of the gas, its temperature and pressure, the characteristics to the substrate, its geometry, and its temperature. The rate and amount of coating can be controlled by varying these parameters. For example, the degree of adherence of the substrate may be controlled by varying the temperature of the substrate. The reactor chamber will typically have a heating jacket or other means of heating the reaction zone where the chemical deposition takes place.

Fluidized beds operating in the fast-fluidized and turbulent fluidization flow regimes had been proposed for various purposes, but not in the context of chemical vapor deposition operations, and particularly not with reference to the coating of very fine particulate materials which fall into Geldhart's class C, which are highly cohesive and difficult to fluidize.

A composite material can usually be defined by three entities, the matrix, the reinforcement, and the interface. The matrix of the composite is the continuous phase, interspersed with particulate reinforcement usually in the form of fibers, whiskers, or granular powders. In cermet and metal matrix composites using particulate as a reinforcement, a uniform dispersion of particles throughout the composite and a strong adhesion of these particles to the matrix are of primary concern. Grain size must be controlled to secure the desired properties. Various expedients such as the addition of grain growth inhibitors, had been proposed to control grain size. Difficulties had been experienced in maintaining the matrix between the particulate material so that the particles did not directly contact one another. In an attempt to prevent the particles from touching one another in the composite, previous expedients often involved the use of excessive matrix material which degraded the physical characteristics of the resulting composites. In certain previous expedients, the powder and the binder were physically blended in an attempt to produce a homogeneous distribution. However, the uniformity of the dispersion and the quality of the resulting product was limited by the non-uniform distribution of the matrix and reinforcement during fabrication. Such segregation was an inevitable result of settling and unequal distribution of the admixture.

Various expedients such as liquid solutions, electroless plating, and precipitation methods had been proposed for coating relatively small particles, however such expedients had not proven to be entirely successful for economically and effectively coating very fine particles without agglomeration, and particularly cohesive particles.

These and other difficulties of the prior art have been overcome according to the present invention.

BRIEF SUMMARY OF THE INVENTION

According to the present invention, chemical vapor deposition techniques are used to economically achieve a thin, substantially uniform, encapsulating coating of, for example, Al, Ni, Co, Fe, Hf, Pd, Sn, Cu, Ag, Cr, or Ti, and the like, alone or in combination with one another, on fine particulates such as, for example, high modulus phase W, WC, $Al_2O_3$, TiC, SiC, C, boron carbide, cubic boron nitride, diamond, and the like, alone or in combination with one another. As will be understood by those skilled in the art, a wide variety of coating reactants and particulate materials may be utilized in the process of the present invention. The chemical vapor deposition is carried out in a system which is operated so as to separate and individually encapsulate the cohesive or very small particulates, including those with high aspect ratios. The individual fine particles are coated so that they are all substantially fully encapsulated within a layer or film of the coating material.

The cost effective deposition of the coating is carried out, for example, in a recirculating fluidizing bed operated in the fast-fluidizing or turbulent fluidization flow regime. In such a bed there is no distinct boundary between the top of the bed and the vapor phase above the bed. The freeboard of the reactor may be such that individual particles are continuously carried upwardly out of the reaction zone.

The chemical vapor deposition coating operation is accomplished, for example, in a heated reaction zone within the fluidized bed. A gas stream is directed upwardly through the bed at a velocity which is generally at least sufficient to operate the bed in the turbulent fluidization flow regime, and may be in excess of the terminal velocity of the particulates in the gas stream. This velocity is generally high enough so that any agglomerates which be formed tend to be broken up by the turbulence and high particle impact velocities within the bed. Agglomerates generally do not appear downstream of the fluidized bed. The gas stream generally includes at least an inert gas such as, for example, nitrogen, and a gaseous reactant such as, for example, cobalt carbonyl, which reacts or deposits and forms the film like layer of encapsulating coating or plating on the particulates. The velocity of the gas stream flowing through the fluidized bed is such that the residence time of the gas within the reaction zone on any given pass is relatively short, generally on the order of from approximately 0.1 to 1 seconds. The gas phase is generally recirculated to the reaction zone. The turbulent movement and high particle impact velocities within the bed tend to keep the Geldhart class C particles separated and prevents them from agglomerating. High gas/solid shear velocities also promote the formation of coatings which fully encapsulate the individual particles with a substantially uniform film or coat. The coating generally does not form as large crystalline growths on the surface of the particulate materials. Other methods of particle coating generally result in substantial agglomeration and non-uniformity in the coatings achieved. In order to prevent agglomeration and obtain adequate coating of fine particulates and cohesive particles it is necessary to operate the system above the bubbling regime. When operating above this regime the particles may be carried through the bed before the desired thickness of coating or plating is achieved. Recirculation of the particles is then necessary. As the particulate makes one pass through the system, the discreet particles accumulate only a small amount of coating material. Multiple passes through the reaction zone may then be necessary to build up the desired coating thickness.

The coated particulate matter is collected, for example, by a filtering process, in one or more cyclones, or by other gas-solid separation processes. The collected particulate matter may then be reintroduced into the hopper for recirculation to the reaction zone. As will be understood by those skilled in the art, sampling and statistical measurements may be utilized to determine the proper number of cycles required to achieve the desired average particle coating, and the operating parameters of the system adjusted to achieve the desired degree of coating. The fluidizing gas stream exits the gas-solid separator and may, if desired, be passed through a heat exchanger before being recirculated through the reactor. Heat from the exiting fluidizing gas stream may be transferred to the gas at the inlet of the reactor chamber using a heat exchanger to thereby improve the efficiency of the reactor. Because of the high gas velocities and flows, the fluidization gas stream is usually compressed and recirculated for economical operation in the turbulent and fast fluidized operating regimes.

The recirculation of the particles in the fluidized bed reactor system, without significant agglomeration, is accomplished, for example, using a collection zone which generally includes a second bed, which may or may not be fluidized, downstream from the reaction zone. The particles are transported from the first bed to the collection zone, for example, by the entraining gas stream from the first bed. When the first bed is operated in the fast-fluidization regime the velocity of the gas or vapor stream is in excess of the terminal velocity of the particles in that stream. The particles are thus quickly carried through the reaction zone and into the collection zone. When operated in the turbulent flow regime the bed is loaded with particulate material to the point where the particles in the upper region of the bed are carried above the upper edge of the free board in the reaction zone. The particles are transported from the second bed to the first bed, for example, by mechanical, pneumatic, or the like means, such as, for example, an auger. The second bed, if it is fluidized, is operated at gas velocities well below the turbulent flow regime. The collection zone acts as a hopper from which particulates are fed to the reaction zone. Particulate material is generally added to the system and withdrawn from the system in the collection zone.

The system can be operated on either a batch or continuous basis. Finished product is generally withdrawn from the system, for example, downstream from the first fluidized bed. Because the velocity of the gas stream in the reaction zone is such that it carries substantially all of the particles upwardly out of the bed in short order, many passes through the reaction zone are generally necessary to adequately coat a particle. The particles, except for agglomerates, are generally not classified in the first bed in the reaction zone because the bed is operated at too high a gas flow rate. Thus, of the particles collected downstream from the first bed, some will have been through the reaction zone more times than others, and the coatings as a percent of the weight of the withdrawn product will vary somewhat from particle to particle. Greater uniformity of the coatings between particles can be achieved by operating the system as a batch process, if desired. In a continuous operation particulate material is generally added to and withdrawn from the collection zone.

Coated particles prepared according to the present invention offer the advantages in fabricated parts of greater homogeneity at the microstructure level. Furthermore, in some cases the use of a fine coating of the matrix material eliminates the need for the presence of an organic binder in the part fabrication process. Also, because the present invention provides very fine particles which are coated so as to be substantially fully and uniformly encapsulated, a better fabricated product with superior properties, less variability, and less matrix material is possible. With a reduction in the quantity and improved distribution of the matrix/binder material, the resulting composites have reduced grain-grain contiguity and improved wear resistant properties. The elimination or reduction of flaws and grain contiguity results in a stronger composite and improved properties.

Metal matrix composites and cermets prepared utilizing fine powders prepared according to the present invention offer attractive mechanical and physical properties such as increased strength and toughness, high specific modulus of elasticities, increased thermal stability, and better wear resistance. Such cermets and metal matrix composites typically consist of a brittle, high modulus phase such as, for example, W, WC, $Al_2O_3$, TiC, SiC, carbon, boron carbide, cubic boron nitride, diamond, and the like, included within a continuous minor matrix phase such as, for example, Al, Ni, Co, Fe, Ti, Ni:Fe, Hf, Pd, Cu, Sn, Ag, Cr, and the like. By selecting specific constituents, composites can be produced with unique properties adapted to resist severe environments and exhibit increase wear resistance.

The process of the present invention has been found to be particularly effect and economical in the production of transition metal coated or plated particles, such as, for example, nickel-iron coated tungsten, cobalt coated tungsten carbide, aluminum and/or titanium coated alumina and/or silicon carbide, and the like.

Cobalt carbonyl is an effective reactant for use in the process of the present invention to form cobalt coatings. Cobalt carbonyl can be generated by the reaction of carbon monoxide with cobalt carbonate at the site where the plating or coating is to be accomplished as it is needed. Inexpensive forms of Cobalt carbonate are generally available. Likewise, iron and nickel carbonyl can be generated by reacting carbon monoxide with iron or nickel powders.

Various particulate materials become Geldhart class C particles at different average particle sizes. Tungsten and tungsten carbide, for example, do not become class C powders until reduced to average particle sizes below 5 microns, and generally below about 4 microns. Tungsten carbide substrate particles having an average particle size of from about 0.1 to 4.5, and preferably 0.1 to 3 microns substantially fully encapsulated by a substantially uniform film or layer of about 3 to 15 and preferably 3 to 10 weight percent of cobalt exhibit substantially improved physical properties. The resulting coated particles are Geldhart class C powders which exhibit the cohesiveness and tendency to agglomerate which are characteristic of class C powders. Products made from these powders also exhibit substantially improved physical properties. Tungsten substrate particulates which have an average diameter of from about 0.1 to 2.5 microns, and are substantially uniformly encapsulated with a film of nickel:iron which comprises approximately 3 to 15 and preferably 3 to 10 percent by weight of the coated particles, and the products made therefrom, likewise exhibit substantially improved physical properties.

The ability to encapsulate Geldhardt class C particles which have high aspect ratios provides some unique materials with outstanding physical characteristics. For example, class C substrate whiskers of silicon carbide, aluminum oxide, and carbon encapsulated with metallic films according to the present invention provide excellent reinforcing materials in various composites. Such substrate whiskers can have aspect ratios of from, for example, approximately 10 or less to as much as 100, or more.

BRIEF DESCRIPTION OF THE DRAWINGS

Referring particularly to the drawings for the purposes of illustration and not limitation.

DETAILED DESCRIPTION OF THE PREFERRED EMBODIMENTS

Figure 1:
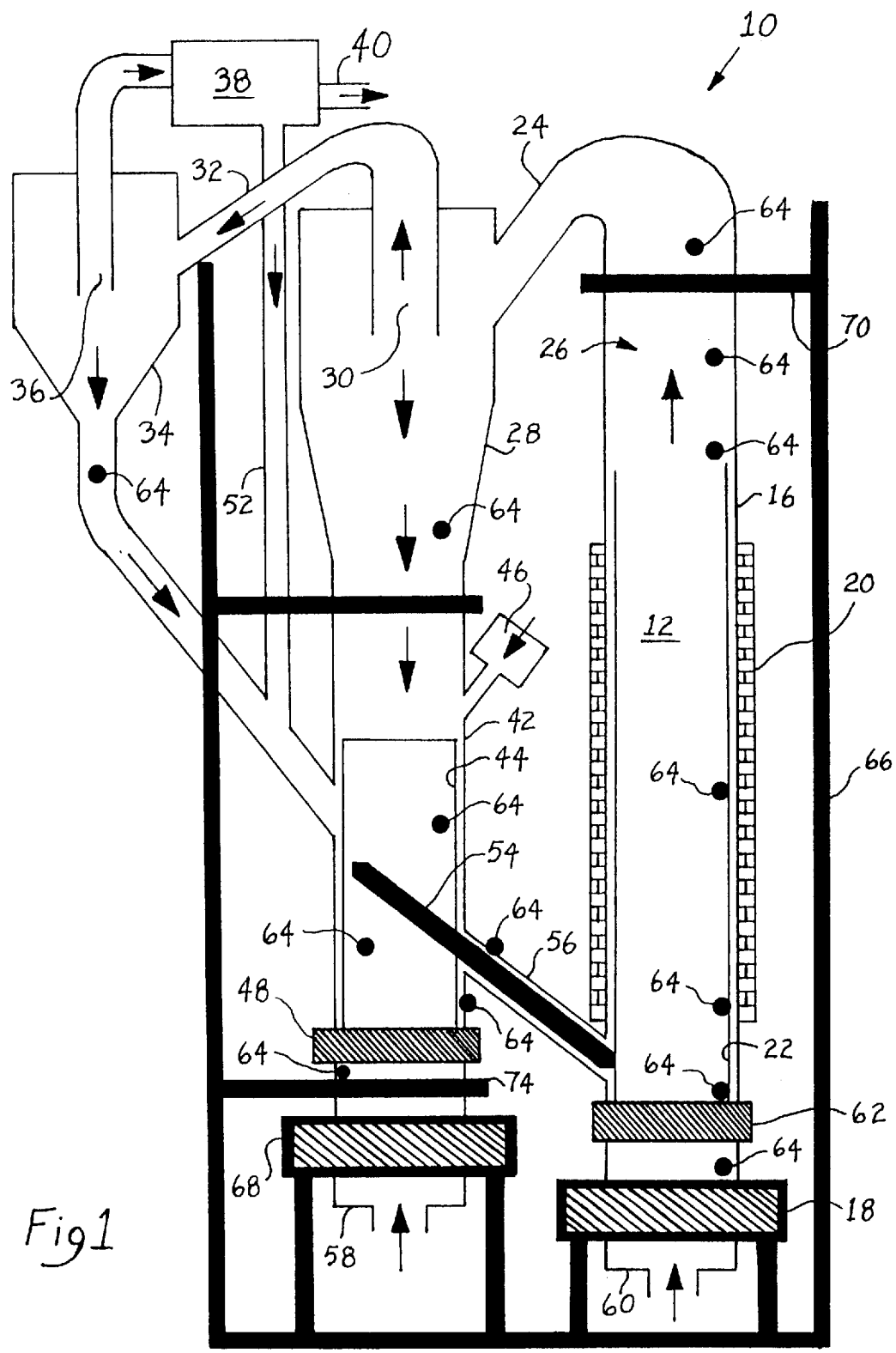
FIG. 1 is a diagrammatic view of a preferred embodiment of the invention.

In the preferred embodiment selected for the purposes of illustration, and not limitation, there is illustrated generally at 10 a recirculating fluidized bed reactor system which comprises a chemical vapor deposition reaction zone 12 and a collection zone 14. Reaction zone 12 is confined within a generally cylindrical reactor or riser 16 which is mounted vertically on stand 18. In one embodiment, reactor 16 is approximately 6 inches in diameter and 10 feet long. A heating jacket 20 surrounds the mid-portion of reactor 16 and serves to heat, for example, a fast-fluidized or turbulent flow bed 22 within the mid-portion of reactor 16. Operation of the fluidized bed in reactor 16 in the fast-fluidized or turbulent flow regime results in a condition where the top of the bed 22 is indistinct. The space above reaction zone 12 in reactor 16 contains a considerable amount of entrained particulate material, as indicated generally at 26. There is insufficient freeboard in reactor 16 above reaction zone 12 to prevent the entrained particulate matter 26 from spilling over into downpipe 24.

When entrained particulate matter 26 enters downpipe 24 it is carried into, for example, first cyclone 28. In first cyclone 28 the entraining and plating vapor or gas stream is discharged through exhaust port 30, carrying whatever fines may be still entrained within it into second downpipe 32 which discharges into second cyclone 34. From second cyclone 34 the gas is exhausted through exit port into filter 38 and recycle conduit 40. As those skilled in the art will appreciate, recycle conduit 40 is adapted to convey the gas to whatever treatment, not shown, is deemed necessary to prepare it for recycle to the reaction zone 12.

In first cyclone 28 the bulk of the particulate material falls downwardly through standpipe 42 into packed bed 44. First cyclone 28 and standpipe 42 comprise a collection zone 14 for the particulate matter.

Particulate matter is generally held in the bed 44 within the collection zone 14 until it is recirculated to the bottom of the reaction zone 12. The collection zone 14 acts as a hopper for the recirculating bed 22. Raw material is conveniently added to the collection zone through intake port 46. Coated particulate material is generally withdrawn from the system in collection zone 14, for example, through combined frit and outlet valve 48. Alternatively, coated particulate matter may be withdrawn from the system elsewhere, such as for example, between reaction zone 12 and packed bed 44.

Particulate matter is carried from second cyclone 34 downwardly through chute 50 to the packed bed 44. Gas is conducted, if desired, from filter 38 to the collection zone through pipe 52 to aid in preventing the packed bed 44 from agglomerating, and to control the gas pressure within the system.

The particulate material in packed bed 44 is recycled to the bottom of the reaction zone 12, for example, by means of an auger which extends from within bed 44 to the bottom of reaction zone 12 through an auger housing 56. Alternatively, the particulate material may be recycled by means of pneumatic pressure or the like, not shown. The packed bed is preferably agitated, at least in the vicinity of auger 54, so as to facilitate the transportation or recycling of the particulate material from packed bed 44 to the reaction zone 12. Such agitation is conveniently accomplished, for example, by the injection of a fluidizing gas into collection zone manifold 58, or by means of vibration, or the like, not shown. When packed bed 44 is fluidized the operating conditions are such that no entrained particulate material is carried upwardly out of the bed. In general, the bed 44 is operated below the bubbling regime.

A heated, pressurized admixture of inert gas and plating gas is supplied to reaction zone manifold 60 from where it is injected into the bottom of reactor 16 through reactor frit 62. This admixture of gas or vapor forms a stream which both fluidizes and plates the particulate matter within reaction zone 12. Additional heat is provided by heating jacket 20. The reactor frit 62 is typically a porous plate and may or may not include anti-backflow devices such as bubble caps.

As will be understood by those skilled in the art, proper control of the recirculating fast-fluidized or turbulent flow fluidized bed requires information as to the temperatures and pressures at various points within the system. To this end various pressure and temperature sensors 64 are provided at various locations within the system. The control of the system may be automated, if desired, by feeding the information from these sensors to a microcontroller, as will be understood by those skilled in the art.

The system is physically supported within enclosure 66 by means of stands 18 and 68 together with supports 70, 72, and 74.

Figure 2:
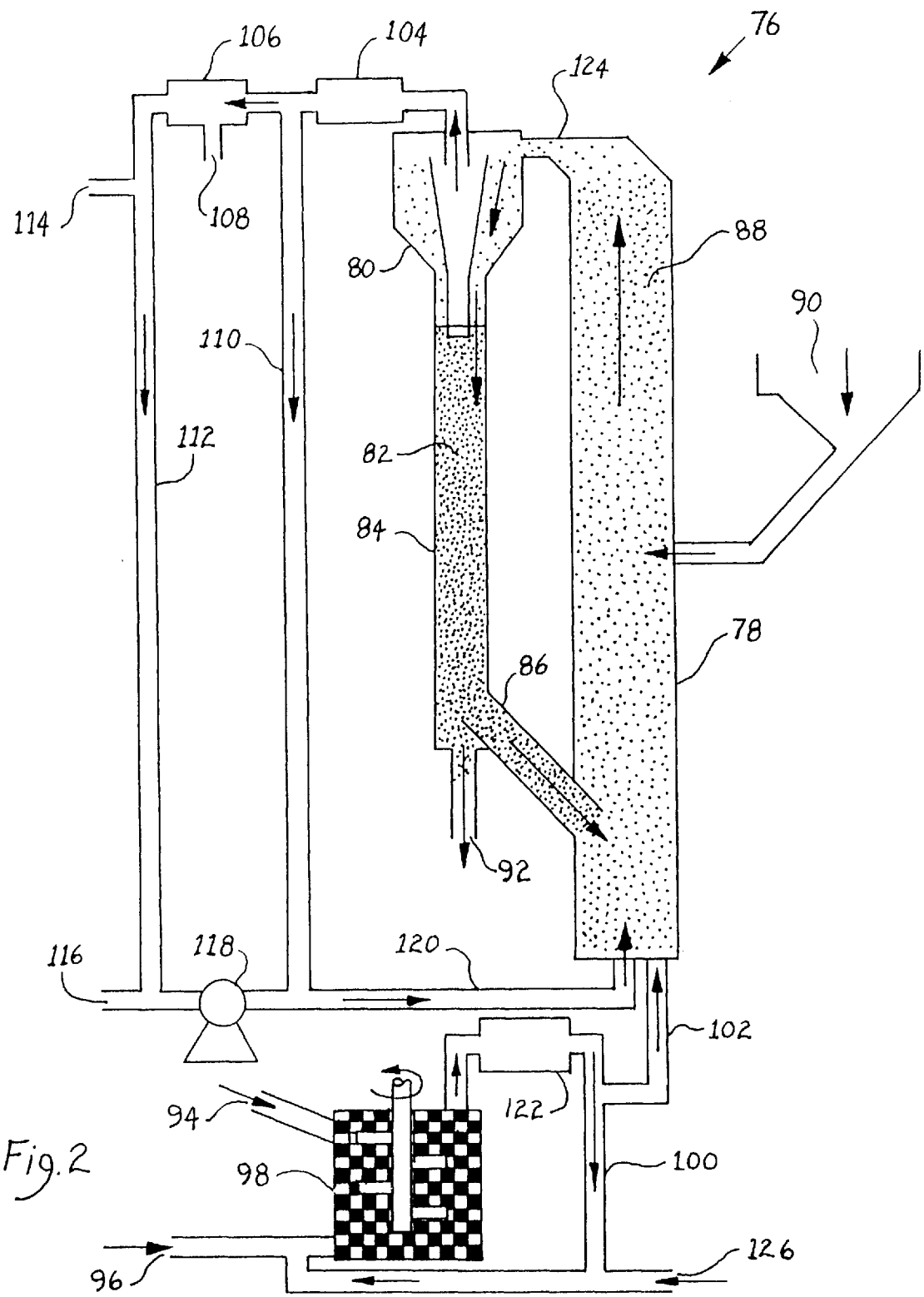
FIG. 2 is a diagrammatic view of a further preferred embodiment of the invention.

With reference, for example, to FIG. 2, a preferred embodiment of the reactor system for coating, for example, cohesive tungsten carbide particles with cobalt is illustrated generally at 76. The continuous system which has been selected for purposes of illustration includes a recirculating fast-fluidized bed reactor or coater 78 in which a fast-fluidized bed 88 is established.

On the solid phase side of the system, the cohesive tungsten carbide particulate raw material is supplied to the heated reactor 78 in such quantities that the freeboard in the reactor permits particulate material to be carried out of the top of the heated reactor 78 through overflow stack 124 and into cyclone 80. In cyclone 80 the particulate material settles into packed bed 82 in vertical hopper 84 and the gas phase is vented to first condenser 104. Most of the particulate material in vertical hopper 84 is recirculated to the bottom of heated reactor 78 by means of feed auger 86. After the reactor has been in operation for a period of time a small fraction of the Geldhart class C cobalt coated tungsten carbide particulate material is withdrawn from the bottom of hopper 84 through coated particulate discharge port 92. Raw material is added to the system through tungsten carbide input hopper 90 so as to maintain the fast-fluidized bed 88 at the desired level where the freeboard in the heated reactor 78 is insufficient to prevent the overflow of particulate material into cyclone 80.

On the gaseous or vapor side of the system, the coating reagent is, for example, cobalt carbonyl [$Co_2(CO)_8$], which is formed by the reaction of powdered cobalt carbonate [$CoCO_3$] with carbon monoxide [CO] in carbonyl generator 98. Powdered cobalt carbonate is feed to generator 98 cobalt carbonate feed port 94, and carbon monoxide and hydrogen are feed to generator 98 through a hydrogen-carbon monoxide inlet port 96. Generator 98 may, for example, take the form of an attritor or ball mill. A mixture of cobalt carbonyl, hydrogen, and carbon monoxide passes from generator 98 to condenser 122. Condensor 122 is operated, for example, at approximately 25 degrees Centigrade. Carbon monoxide is recycled to generator 98 through carbon monoxide recycle line 100. The carbonyl reactant is feed to the bottom of heated reactor 78 through carbonyl feed line 102. Fluidizing nitrogen gas is supplied through nitrogen supply inlet 116 and is forced by gas pump 118 through gas inlet line 120 into the bottom of heated reactor 78. Gas or vapor from the top of cyclone 80 passes first through first condensor 104, which is operated, for example, at approximately 10 degrees Centigrade, and then to second condenser 106, which is operated, for example, at approximately –60 degrees Centigrade. A carbon monoxide outlet 108 is provided at second condensor 106. A cobalt carbonyl recycle line 110 is provided between first condensor 104 and second condensor 106. A hydrogen and nitrogen recycle line 112 is provided downstream from second condensor 106 to recirculate these materials to the reactor 78. A gas or vapor outlet from the system is provided at 114. If desired carbon monoxide may be recycled to generator 98 through port 126.

In continuous system 76 both the vapor phases and the solid phase are recirculated. Appropriate condensers are utilized to enable the efficient handling of the vapor phase and its components. The powdered cobalt carbonate feed need not be pure. It may contain other materials so long as the other materials do not interfere with the necessary reactions in the system. Indeed, it may be substantially an as mined cobalt ore, if desired.

A bed of Geldhart class C tungsten carbide (WC) particulate material having an average particle size of from about 1 to 3 microns was placed in a recirculating turbulent fluidization flow bed reactor chamber, and a fluidizing flow of heated nitrogen gas (200 degrees Centigrade) was introduced into the chamber to fully fluidize the particulate WC particles. Cobalt acetylacetonate was sublimed at 65 degrees Centigrade in a sublimation chamber, and the vaporous cobalt acetylacetonate was fed into the fluidized bed reaction chamber to react on the WC particulate. The average residence time within the reaction zone for each pass through the reactor was approximately 60 seconds. The total combined residence time to achieve the desired coating thickness was approximately 400 minutes. The resulting particles had a 5 weight percent cobalt coating in the form of a generally uniform film or coating on the WC substrate. The cobalt coating did not show any evidence of crystal or nodular formation on the surface of the particles. The coated particles were cold-pressed, without the addition of a hydrocarbon binder, and consolidated using rapid solid state consolidation procedures. The resulting composite retained the 1 to 3 micron grain size, had near zero WC—WC grain contiguity, had equivalent fracture toughness and transverse rupture strength as conventional WC-10 percent cobalt mixture consolidated by liquid phase sintering, and possessed higher hot hardness and wear resistance. The resulting material was especially suited for cutting tools and forging dies.

A bed of 0.2–0.8 micron average diameter tungsten carbide (WC) substrate particulate was placed in a fast-fluidizing bed reactor chamber, and a fast fluidizing flow of heated nitrogen was introduced into the chamber to fully fluidize the WC particulate. Dicobalt Octacarbonyl powder was fed into the reactor chamber. The resulting carbide powder had a 5 percent by weight cobalt coating on the substrate, and can be cold pressed and consolidated using a rapid consolidation process without the need of a binder. The resulting compact has increased strength, toughness, and wear resistance compared to conventionally processed WC cermets, and is suitable for use as cutting tools, drill bits, atomization nozzles, and hot forging dies.

A bed of 1–3 micron average diameter tungsten particulate were placed in a fast-fluidizing bed reactor chamber, and a fluidizing flow of nitrogen was introduced into the chamber to fluidize the tungsten particulate. A mixture of 70 weight percent Ni, 30 weight percent Fe is introduced into the fluidized chamber by decomposing a mixture of $Ni(CO)_6$ and $Fe(CO)_5$. The resulting particles had about a 5 percent by weight coating of the 70 weight percent Ni, 30 weight percent Fe mixture, which may be cold isostatically pressed using a rubber or latex die and sintered into a net shape warhead suitable for use in combined effect or fragmenting warhead munitions.

A bed of silicon carbide (SiC) substrate whiskers having an average diameter of about 10 microns and an average aspect ratio of about 40 are fluidized in a reactor chamber using a fast fluidized flow, and coated with about a 20 percent by volume coating of aluminum by decomposition of triisobutyl aluminum. The Geldhart class C coated whiskers are then blended with Si, Fe, and Mg alloying elements, cold pressed and sintered to full density while retaining a SiC whisker reinforcement content of 65 to 75 weight percent. The resulting metal matrix composite retains its mechanical properties to 750 degrees Fahrenheit and has improved wear resistance and elevated temperature mechanical properties as compared to conventional aluminum alloys and aluminum matrix composites. The resultant material is suitable for use as automotive piston inserts and other wear resistant applications.

A bed of chopped carbon fibers having an average diameter of about 5 to 7 microns and an average aspect ratio of about 40 may be fluidized in a reaction chamber using a fast-fluidized flow and coated with a fraction of a micron of titanium carbide using the decomposition of titanium bipyridine. These substrate whiskers may be subsequently coated with about 10 to 40 percent by volume of a copper-tin mixture using the decomposition of copper acetylacetonate and tetramethyl tin. The coated whiskers may then be cold pressed and sintered to about 75 to almost 100 percent of theoretical density while retaining about 30 to 60 percent by volume of carbon fiber reinforcement. The resulting metal matrix composite will be suitable, for example, for use as low expansion, high conductivity electronic heat sinks, particularly when high conductivity carbon fibers are utilized as the carbon substrate. Also, the resulting metal matrix composite will be suitable, for example, for use as an improved semi-metallic friction and/or brake material. The use of low cost carbon fibers makes these composites particularly attractive.

A bed of tungsten powder in which the particles have an average diameter of about 3 microns may be fluidized in a reactor using a turbulent fluidization flow, and coated with approximately 20 to 30 percent by volume of a mixture of titanium and hafnium. These coated powders are then blended with a transient liquid phase sintering aid, for example, copper, nickel, palladium, and the like, as sintering aids. The resulting admixture may be cold-pressed into a compact at approximately 5000 to 20,000 pounds per square inch applied load. The resulting compact may then be transient liquid phase sintered at a temperature between about 700 and 950 degrees Centigrade, and annealed to form a high density alloy material. The material may be further densified, for example, using high energy rate or upset forging, or through swagging to form a fully dense penetrator material mimicking the properties of depleted uranium.

A bed of abrasive substrate material, such as, for example, $B_4C$, SiC, cubic boron nitride, diamond, and/or aluminum oxide (alumina) having an average particle size and aspect ratio that make them a Geldhart class C cohesive powder may be fluidized in a fast-fluidized or turbulent fluidization flow reactor and coated with a thin (less than approximately 0.5 microns) smooth layer of titanium using the decomposition of a titanium halide at about 800 to 950 degrees Centigrade. These titanium coated abrasives are then further coated with a mixture of, for example, copper and palladium to form a transient liquid phase sinterable abrasive Geldhart class C particle having, for example, from approximately 10 to 40 percent by volume of the copper and palladium coating. These coated particulates may then, for example, be cold pressed and sintered to form a metal bonded abrasive showing dramatically increased strength and toughness, or they may be plasma sprayed or painted onto a substrate, followed by heat treatment to form an abrasive cutting surface.

In general the smooth film-like encapsulating coatings according to this invention can vary from as little as about 1 to as much as about 30 weight percent of the encapsulated particle. Where interlayers are used they are generally very thin, for example, no more than approximately 1 micron thick. In general, for most applications, the amount of the coating is preferably minimized consistent with securing the desired physical properties. The smooth, substantially uniform, amorphous or nano-crystalline, film-like nature of the coatings, together with the substantially complete encapsulation, are believed to contribute significantly to the advantages of the present invention.

What has been described are preferred embodiments in which modifications and changes may be made without departing from the spirit and scope of the accompanying claims.

What is claimed is:

1. A method of coating Geldhart class C particulate matter which comprises:
   establishing a heated reaction zone;
   selecting a plating reactant and establishing a vapor phase stream including said plating reactant flowing generally upwardly through said reaction zone at a predetermined rate;
   selecting said Geldhart class C particulate matter, said Geldhart class C particulate matter having a cohesive nature, and introducing said Geldhart class C particulate matter into said heated reaction zone to establish a fluidized bed;
   allowing said plating reactant to react in said reaction zone and form a coating on said Geldhart class C particulate matter to form coated particulate matter;
   adjusting said predetermined rate of said vapor phase stream to operate said fluidized bed in a fast-fluidized or turbulent fluidized flow regime;
   allowing said coated particulate matter to be carried upwardly out of said reaction zone by said vapor phase stream;
   collecting said coated particulate matter downstream from said reaction zone, and separating said coated particulate matter from said vapor phase stream; and
   maintaining said coated particulate matter separate from said vapor phase stream while introducing at least a part of such separated coated particulate matter back into said fluidized bed.

2. A method of coating of claim 1 including adjusting the predetermined rate of said vapor phase stream to a rate which is sufficient to operate said fluidized bed in the turbulent fluidized bed regime.

3. A method of coating of claim 1 including adjusting the predetermined rate of said vapor phase stream to a rate which is sufficient to operate said fluidized bed in the fast fluidized bed regime.

4. A method of coating of claim 1 wherein said selecting a plating reactant comprises selecting a plating reactant comprising cobalt carbonyl; and generating said cobalt carbonyl by reacting carbon monoxide with cobalt carbonate to produce cobalt carbonyl.

5. A method of coating of claim 1 wherein said selecting a plating reactant comprises selecting a plating reactant comprising cobalt carbonyl.

6. A method of coating of claim 1 wherein said selecting said Geldhart class C particulate matter comprises selecting a Geldhart class C particulate matter comprising tungsten.

7. A method of coating of claim 1 including allowing said plating reactant to react in said reaction zone to form a coating comprising nickel.

8. A method of coating of claim 1 including allowing said plating reactant to react in said reaction zone to form a coating comprising iron.

9. A method of coating of claim 1 wherein said selecting a plating reactant comprises selecting a plating reactant comprising iron carbonyl; and
   generating said iron carbonyl by reacting carbon monoxide with iron to produce iron carbonyl.

10. A method of coating of claim 1 wherein said selecting a plating reactant comprises selecting a plating reactant comprising nickel carbonyl; and
    generating said nickel carbonyl by reacting carbon monoxide with nickel powder to produce nickel carbonyl.

11. A method of coating of claim 1 wherein said establishing a vapor phase stream comprises establishing a vapor phase stream comprising an inert gas and a reactive gas.

12. A method of coating of claim 1 including filtering said vapor phase stream and recirculating said vapor phase stream to said reaction zone.

13. A method of coating of claim 1 including heating said vapor phase stream prior to its introduction into said reaction zone.

14. A method of coating of claim 1 wherein said selecting Geldhart class C particulate matter comprises selecting Geldhart class C particulate matter comprising tungsten carbide.

15. A method of coating particulate matter which comprises:

establishing a heated reaction zone;

selecting a plating reactant and establishing a vapor phase stream including said plating reactant flowing generally upwardly through said reaction zone at a predetermined rate;

selecting particulate matter which comprises a Geldhart Class C powder and introducing said particulate matter into said heated reaction zone to form a fluidized bed;

allowing said particulate matter to be carried through said reaction zone by said vapor phase stream;

allowing said plating reactant to react in said reaction zone and form a coating on said particulate matter to form coated particulate matter;

adjusting the predetermined rate of said vapor phase stream to a rate which is at least sufficient to operate said fluidized bed in a fast-fluidized or turbulent fluidized flow regime;

collecting said coated particulate matter downstream from said reaction zone in a packed bed in a collection zone;

recirculating a portion of said coated particulate matter directly from said packed bed to said fluidized bed; and harvesting at least a portion of said coated particulate matter from said collection zone.

16. A method of coating of claim 15 wherein said packed bed comprises a dense fluidized bed and including feeding said particulate matter into said reaction zone from said dense fluidized bed.

17. A fluidized bed reactor process for coating Geldhart class C particulates comprising:

selecting Geldhart class C particulate material;

establishing a first fluidized bed of such Geldhart class C particulate material;

establishing a heated reaction zone in said first fluidized bed;

maintaining said first fluidized bed by injecting a fluidizing stream of vapor, including plating reactant, into said first fluidized bed at a first velocity, said first velocity being sufficient to operate said first fluidized bed above the bubbling fluidized bed regime;

allowing said plating reactant to form a coating on said Geldhart class C particulate material in said heated reaction zone to produce coated particulate material;

collecting at least a substantial portion of said coated particulate material downstream from said reaction zone in a packed bed in a collection zone;

transporting at least a part of said packed bed from said collection zone to said heated reaction zone.

18. A fluidized bed reactor process of claim 17, including introducing said Geldhart class C particulate material into said collection zone.

19. A fluidized bed reactor process of claim 17, including withdrawing a portion of the Geldhart class C particulate materials from said collection zone.

20. A method of coating of claim 17 wherein said first velocity is sufficient to operate said first fluidized bed in a fast-fluidized bed regime.

21. A method of coating of claim 17 wherein said first velocity is sufficient to operate said first fluidized bed in a turbulent fluidized bed regime.

22. A method of coating particulate matter which comprises:

establishing a heated reaction zone;

selecting a plating reactant and establishing a vapor phase stream including said plating reactant flowing generally upwardly through said reaction zone at a predetermined rate;

selecting Geldhart class C particulate matter, said Geldhart class C particulate matter having a cohesive nature, and introducing said Geldhart class C particulate matter into said heated reaction zone to establish a fluidized bed comprising said Geldhart class C particulate matter;

allowing said plating reactant to react in said reaction zone and form a coating on said Geldhart class C particulate matter to form coated particulate matter;

adjusting said predetermined rate of said vapor phase stream to operate said fluidized bed in a fast-fluidized or turbulent fluidized flow regime; and recovering said coated particulate matter from said reaction zone.

23. A method of claim 22 including selecting a metal for at least one of said Geldhart class C particulate matter or said coating.

24. A method of claim 22 including selecting a carbide for at least one of said Geldhart class C particulate matter or said coating.

25. A method of claim 22 including adjusting said predetermined rate of said vapor phase stream to operate said fluidized bed in a turbulent fluidized flow regime.

26. A method of claim 22 including introducing said Geldhart class C particulate matter into said heated reaction zone to establish a recirculating fluidized bed.

* * * * *